United States Patent
Kozlowski et al.

(10) Patent No.: US 6,853,918 B2
(45) Date of Patent: Feb. 8, 2005

(54) ELECTRONIC COMPASS

(75) Inventors: Janusz Kozlowski, Nuoro (IT); Paolo Palangio, L'Aquila (IT)

(73) Assignee: Sulas Sergio, Bolotana (IT)

( * ) Notice: Subject to any disclaimer, the term of this patent is extended or adjusted under 35 U.S.C. 154(b) by 0 days.

(21) Appl. No.: 10/275,393

(22) PCT Filed: May 3, 2001

(86) PCT No.: PCT/EP01/04970
§ 371 (c)(1),
(2), (4) Date: Apr. 27, 2003

(87) PCT Pub. No.: WO01/84079
PCT Pub. Date: Nov. 8, 2001

(65) Prior Publication Data
US 2003/0167122 A1 Sep. 4, 2003

(30) Foreign Application Priority Data
May 3, 2000 (IT) ..................................... CA2000A0011

(51) Int. Cl.⁷ ............................................... G01C 17/30
(52) U.S. Cl. .......................... 701/224; 702/92; 73/1.76; 33/319
(58) Field of Search .................. 701/34, 200, 216–217, 701/220–221, 224; 702/90, 92–95; 73/1.76; 33/316, 319

(56) References Cited

U.S. PATENT DOCUMENTS

| | | | |
|---|---|---|---|
| 3,895,869 A | | 7/1975 | Lewis |
| 4,157,619 A | | 6/1979 | Zuvela |
| 4,262,427 A | * | 4/1981 | Lynch et al. .................. 33/361 |
| 5,339,246 A | | 8/1994 | Kao |
| 5,564,194 A | * | 10/1996 | Fujita et al. .............. 33/355 R |

FOREIGN PATENT DOCUMENTS

| | | |
|---|---|---|
| EP | 0087890 | 2/1983 |
| GB | 2044460 | 10/1979 |

\* cited by examiner

*Primary Examiner*—Thu V. Nguyen
(74) *Attorney, Agent, or Firm*—Sampson & Associates

(57) ABSTRACT

An electronic compass comprises a saturable core sensor (2) with a core (3) made of ferromagnetic material surrounded by an electric winding (3'), a first couple of electric windings (4, 5) around the sensor (2) having reciprocally orthogonal turns, a second couple of electric windings (8, 9) around said first couple (4, 5) having reciprocally orthogonal turns. The gap between the winding (3') and the first couple of windings (4, 5) and between the first couple of windings (4, 5) and the second couple of windings (8, 9) is filled with a material having a low thermal expansion coefficient, preferably epoxy fiberglass reinforced plastic, supporting the windings of said first (4, 5) and second (8, 9) couple of windings. It is also provided an electronic control circuit (20, 21, 22).

16 Claims, 4 Drawing Sheets

ELECTRONIC COMPASS

Figure 1:
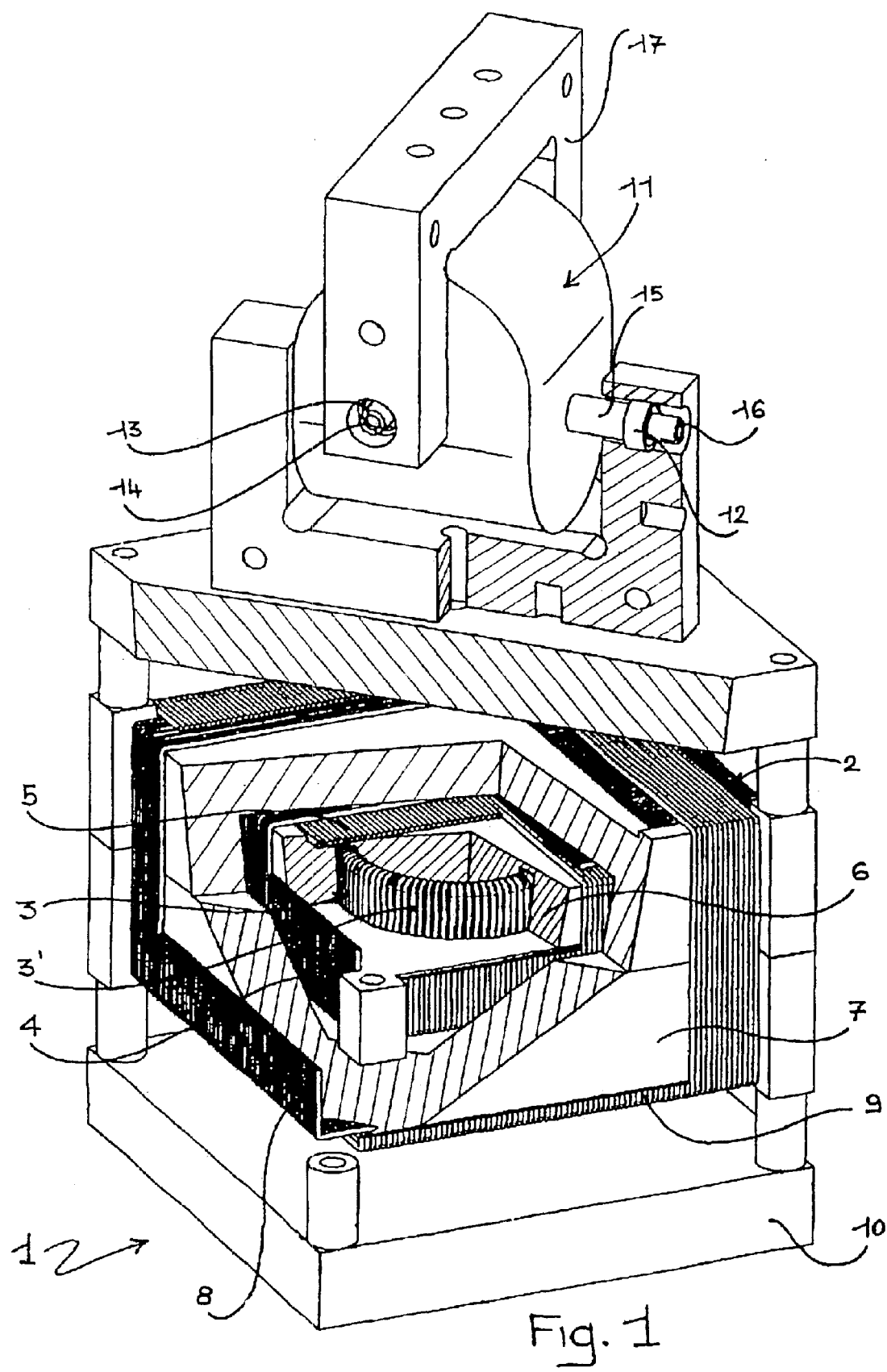

This application claims priority to International Patent Application Serial No. PCT/EP01/04970 filed on May 3, 2001, claiming priority to Italian Patent Application Serial No. CA00A000011 filed on May 3, 2000.

FIELD OF THE INVENTION

The present invention concerns an electronic flux-gate compass which is mainly, but not exclusively, designed as an equipment for boats or any kind of vehicles.

BACKGROUND INFORMATION

Analogical electronic compasses have been known and have been commercially available for a long time. They comprise at least a saturable core sensor (flux-gate sensor) with a variable reluctance, whose output signals are correlated moment by moment to the angle comprised between the geographical North and the longitudinal axis of the vehicle (course angle); usually, the output signals of the sensor are respectively proportional to the sine and the cosine functions of the detected course angle. An electronic compass of this kind is disclosed in the European patent application EP-A-87890.

Said compasses usually make errors because of known or foreseeable reasons, such as, for instance, the magnetic deviation due to several elements. First of all, the earth's magnetic field is not homogeneous, but has a maximum intensity in the equatorial areas and a minimum intensity in the polar areas, showing also local distortions. Furthermore, the magnetic North does not coincide with the geographical North. Said errors can be avoided by suitably calibrating each compass. Especially during long trips, said lack of homogeneity in earth's magnetic field requires the frequent repetition of the calibrating process, which is usually long and expensive.

Another source of errors can be the supporting means connecting the compass to the boat, and keeping said compass, and in particular its sensor, in an horizontal position, or in any pre-arranged constant position, thus counterbalancing the heelings of the boat, or the sliding of the vehicle, due to the wave-motion and/or to the boat manoeuvres, for instance to a veer. If the heeling angle is larger than the maximum angle that may be counterbalanced by the supporting means, the compass, and in particular its sensor, follows the boat heeling, thus leaving the aforesaid pre-arranged position.

As a consequence, the intensity of the earth's magnetic field detected by the sensor is lower than, or different from the real one, and the compass "marks" a course angle which is different from the real one. This kind of error can be particularly relevant in the navigation on the high seas when the navigation is controlled by the automatic pilot, interlocked to the compass, which can consider the compass error as a course error, thus correcting it and leading the boat astray. In order to avoid this kind of errors, compasses usually hang from a support, such as a universal joint.

In order to allow the compass to work always with the same correctness, it must have a high angle sensitivity and good working dynamics, wherein angle sensitivity means the smallest angle the compass can detect, and working dynamics means the capability of maintaining the same sensitivity with varying conditions of the magnetic field.

SUMMARY OF THE INVENTION

The object of the present invention is an electronic flux-gate compass which is free from the aforesaid errors and limits of known compasses and which presents a high angle sensitivity and good working dynamics.

It is a further object of the present invention to provide an electronic compass which can work also under extreme environmental conditions.

Another object of the present invention is to provide a compass which can be used under exceptional dynamical conditions.

Said objects are attained by an electronic compass which, according to claim 1, comprises at least a saturable core sensor with a core of ferromagnetic material surrounded by an electric exciting winding and electronic control means, where the sensor comprises, combined each other, the core, made of a ferromagnetic material and surrounded by the exciting winding;

a first gap, provided between the exciting winding and a first couple of windings having reciprocally orthogonal turns and filled by first rigid means;

the first couple of windings, surrounding the first rigid means;

a second gap, provided between the first couple of windings and a second couple of windings having reciprocally orthogonal turns and filled by second rigid means; and the second couple of windings, surrounding the second rigid means.

Thanks to the use of such counterbalancing electric windings it is possible to obtain a very high linearity in the dynamical reaction of sensor.

According to a further advantageous feature of the invention, the compass is connected to the vehicle by means of gimbals which allow the compass to take angles of inclination in relation to the vehicle till ±75°. Since the gimbals are not damped, the sensor oscillations, excited by the movements of the vehicle, produce an undesired modulation of the output signals X and Y. Said modulation is avoided by means of a particular arrangement of the sensor's axis in relation to the gimbals oscillating axis, namely a non-linear intermodulation of X and Y signals. This allows to determine exactly the course angle without using a complex system of viscous damping of the mobile equipment. Besides simplifying the structure of the gimbals, this solution advantageously allows a quicker reaction of the compass to the fast course changes of the vehicle. In fact, the compass follows the course changes of the vehicle with a maximum delay of 1 second.

LIST OF THE DRAWINGS

Figure 2:
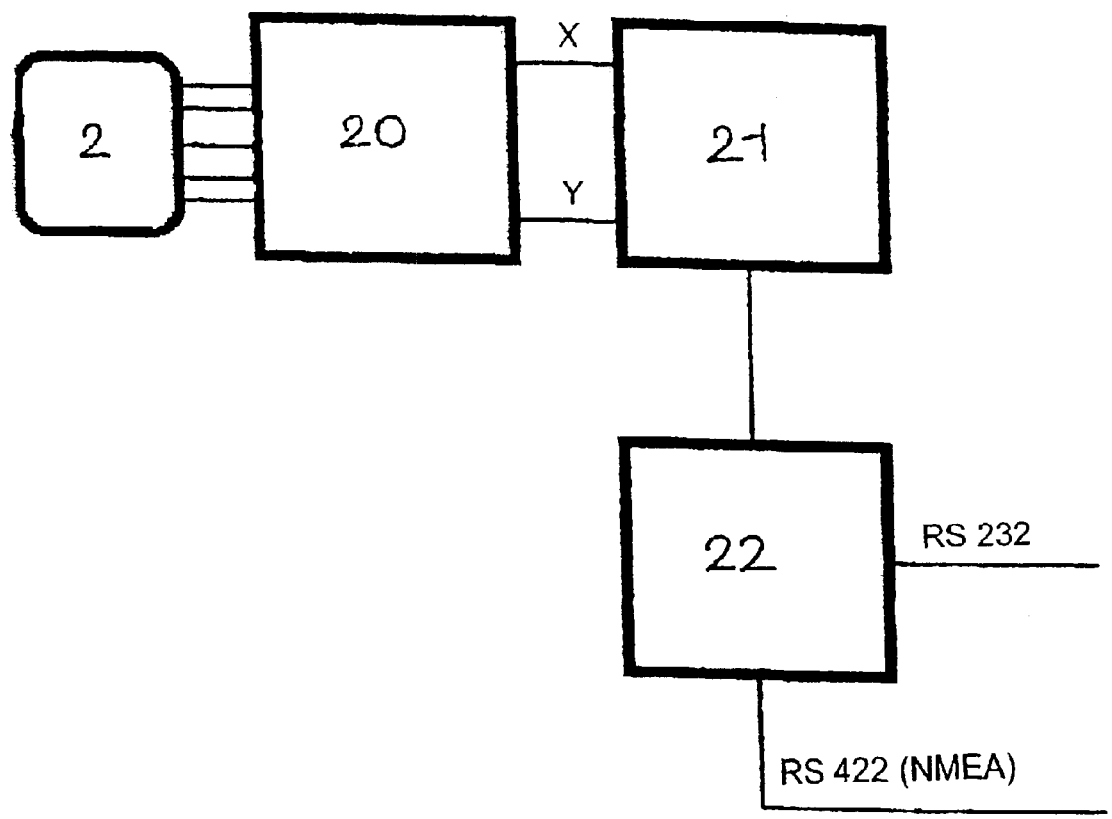
Figure 3:
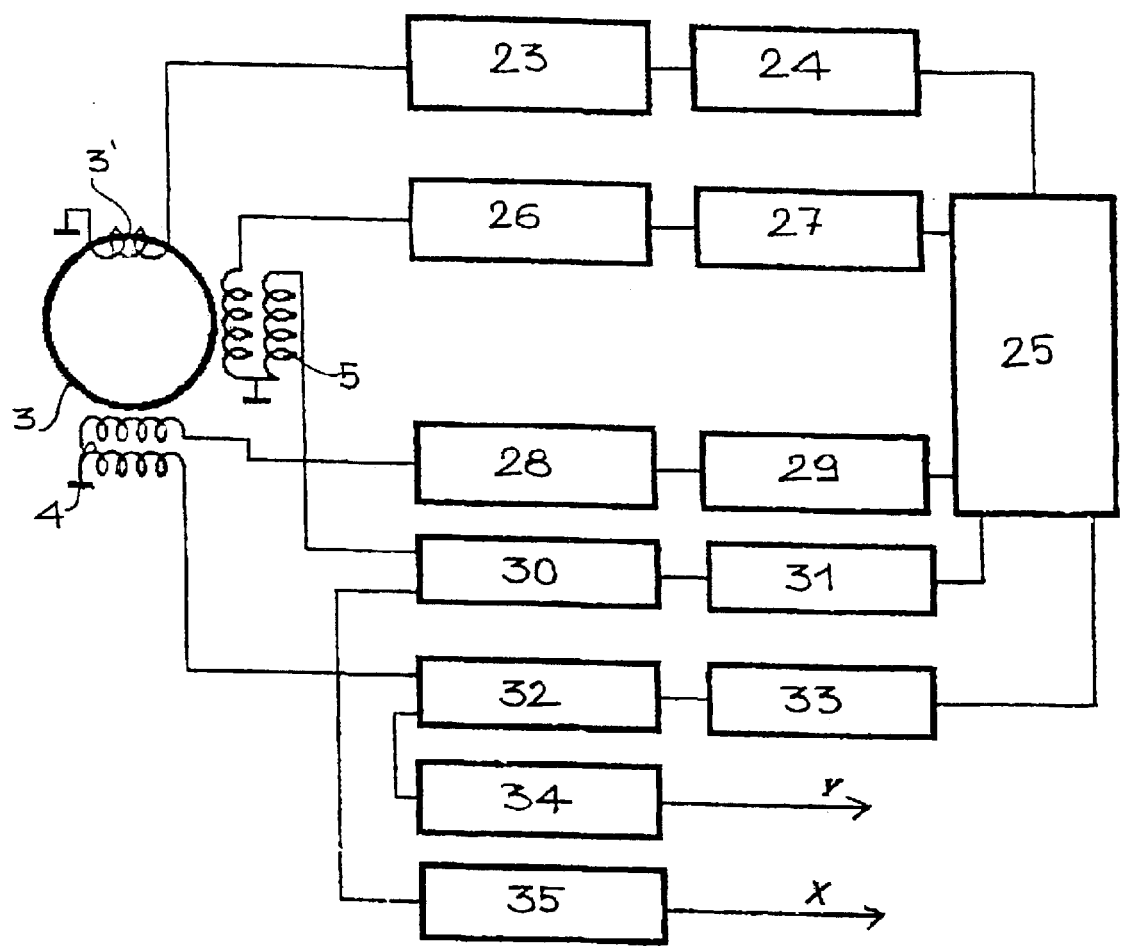
Figure 4:
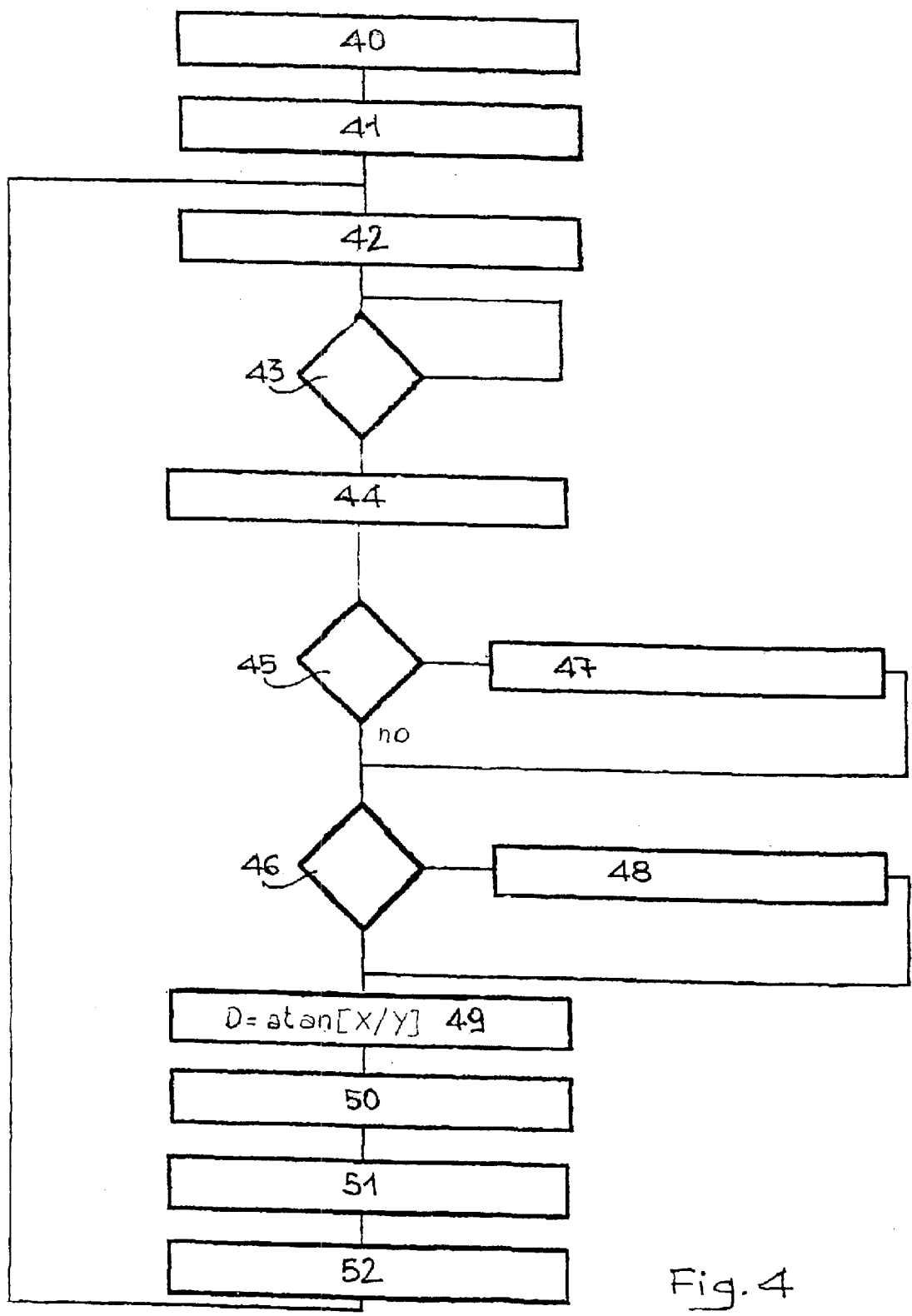

The present invention will be described in greater detail with reference to a non-limitative embodiment shown in the enclosed figures, wherein FIG. 1 shows a prospect view with a partial cross-section of a compass according to the invention;

FIG. 2 schematically shows the block diagram of the electronic control system of the compass of FIG. 1;

FIG. 3 schematically shows the block diagram concerning a detail of the electronic control system of the compass of FIG. 1;

FIG. 4 shows the block diagram concerning the compass controlling software of FIG. 1.

In the enclosed figures corresponding elements will be identified by the same references.

DETAILED DESCRIPTION OF THE INVENTION

FIG. 1 shows a compass 1 according to the invention, comprising:

a saturable core sensor 2 having a toroidal core 3 made of aluminium whereon it is provided a first exciting winding 3' forming a coil of amorphous ferromagnetic material. A couple of electric windings (4, 5) respectively orthogonal, surrounds said coil. Said windings (4, 5) surround the supporting element 6 made of nonmagnetic material wherein the toroidal core 3 is immersed and they can emit two signals which are proportional to the horizontal components of the earth's magnetic field.

The supporting element 6 is advantageously made of epoxy fibreglass reinforced plastic, which guarantees a good mechanical performance thanks to its low thermal expansion coefficient, which is about 7 ppm/° C.

It is provided a second supporting element 7 made of non-magnetic material completely surrounding the first supporting element, whereon it is provided a second couple of electric windings (8, 9) having reciprocally orthogonal turns.

The sensor is placed in a rigid frame 10, supporting and connecting it to the suspension means, advantageously gimbals 11, which, on their turn, are steadily fixed to the boat or vehicle frame. The gimbals allow the sensor 2 to take an inclined position in relation to the vehicle till ±75°. It comprises four ball bearings (12, 13), two of them being visible in FIG. 1, made of a non-magnetic alloy, for example cupper-beryllium, two central supporting axis (14, 15), made of a non-magnetic material, preferably a cupper-tin alloy, and two supporting elements 16, 17 made of non-magnetic material, for example aluminium, wherein the aforesaid bearings (12, 13) are inserted.

In order to allow sensor 2 to counterbalance the heelings of the boat, the aforesaid two axis are placed on overlapping planes in order to form a composite pendulum having two different oscillating frequencies. In this way the counterbalanced inclination angle of the boat or vehicle is larger than the one allowed by known suspension means.

The axis of sensor 2 are turned of 45° in relation to the suspension oscillating axis so that they avoid a modulation in determining the course angle by means of a non-linear intermodulation.

The sensor can also be used without gimbals. In this case the oscillations of the boat or vehicle can be counterbalanced by a biaxial clinometer.

The sensor works as follows. A pulse current runs across the exciting winding 3', said current periodically saturating the core; preferably, but not necessarily, said pulse current has a frequency of 9.6 KHz and its pulses have a duration of 5microseconds and an intensity of 100 A/m. Through each winding (8, 9) runs a signal having a proportional amplitude and an opposite direction in relation to the signal emitted by the corresponding winding of the first couple (4, 5) thus dynamically compensating the effect on the toroidal core 3 of the amplitude and/or of local lack of homogeneity of the earth's magnetic field. By exciting the windings in the aforesaid manner, sensor 2 emits two signals (X, Y) related to the detected course angle.

We will hereinafter describe the electronic control circuit of the compass with a particular reference to FIGS. 2, 3, 4.

The part of the circuit which is necessary for controlling the signals comprises three electronic circuits represented in FIG. 2 by block 20 and shown in greater detail in FIG. 3. Sensor 2 is connected to the signal control system 20 emitting signals X, Y which, on their turn, are fed into an analogical/digital converter 21 having a double channel. Said converter is connected to the logical unit 22 containing a memory communicating with the logical unit 22. Answering to the signals emitted by converter 21, the logical unit 22 addresses a memory cell containing correction parameters which are then used to detect the real course angle.

Usually, but not necessarily, sensor 2 provides for the course angle in parametric form, e.g. signals X and Y are respectively proportional to the sine and cosine functions of the course angle, so that it is possible to obtain the aforesaid angle in a known way by means of a circuit, already known, providing for the course angle in analogical form.

Without leaving the scope of the invention, it is also possible to leave out the memory; in this case the logical unit 22 determines the real course angle as an answer to the signals emitted by converter 21.

The real course angle is sent from logical unit 22 to display means, already known, and/or to an automatic pilot.

FIG. 3 shows in more detail the circuit forming the signal control system 20. The exciting winding 3' surrounding the toroidal core is connected to a parametrical oscillator 23 which, on its turn, is connected to an oscillator 24 and to a vectorial cross-correlator 25.

The winding 5 of the first couple of windings is composed by a detecting winding and a feedback winding. The detecting winding is connected to a synthetic inductor 26 and to a pre-amplifier 27 feeding signal X into the cross-correlator 25.

The other winding 4 is composed by a detecting winding and a feedback winding. The detecting winding is connected to a synthetic inductor 28 and to a pre-amplifier 27 transmitting signal Y to the cross-correlator 25.

In this way the signal/noise ratio of the signals emitted by windings (4, 5) is optimised.

Feedback signals X and Y produced by cross-correlator 25 are transmitted to respective integrators (31, 33) and to transconductance amplifiers (30, 32) where they are further sent to the respective feedback windings 8 and 9. Through these windings a current runs, which generates, in the volume occupied by the toroidal core, a magnetic field having the same intensity but the opposite direction as the measured one, so that it constantly keeps the core in a null field, aside from the variations of the external field due to the course changes of the vehicle and to the variations of the local field. This aims to obtain the highest working linearity of the compass. The transconductance amplifiers (30, 32) transmit signals X, Y also to respective second-order Bessel filters (34, 35) emitting signals X, Y which are fed into the two-channel, analogical/digital converter 21.

The compass can also advantageously comprise a satellite auto-locating unit, for instance of the GPS type, from which it acquires further data which are used, together with the correction parameters obtained from the memory, to settle the real course angle. Without leaving the scope of the invention, it is also possible to omit the satellite auto-locating unit.

Auxiliary equipments, such as the satellite auto-locating unit, the display means, the automatic pilot, etc. which are generally used on boats or in some kinds of vehicles "communicate" by means of a protocol known as "NMEA". In order to make the compass compatible with said equipments, the signals from converter 21 are converted into signals consistent with the "NMEA" protocol by means of a transcoder (not shown).

The whole electronic system of the compass is controlled by a software whose block diagram is shown in FIG. 4 and is schematically described hereinafter.

Block 40 represents the initialisation step of the logical unit 22 and block 41 represents the initialisation step of the analogical/digital converter 21. Afterwards the timer (block 42) is started and the time is set to zero (block 43). In the following step, represented by block 44, signals X, Y are read by the sensor. If the Y value is equal to zero (block 45)

it is set to 0.000001 (block 47), whereas if the X and Y values exceed 2500 (block 46) they are treated by a Wiener filter (block 48). Block 49 calculates the direction on the basis of received X and Y values and then block 50 carries out the conversion radians to degrees convertion. These final values of the direction are formatted in order to fit them to the NMEA protocol (block 51) and finally they are formatted to fit them to the used display (block 52).

If the satellite auto-locating unit is present, the logical unit 22 acquires further data from said unit.

Therefore, the logical unit 22 determines the real course angle and sends it to the display means and/or to the automatic pilot, if they are provided, before coming back to step 42 to acquire once again the signals emitted by sensor 2 and repeating the same cycle.

If the memory is omitted, also the corresponding steps of recalling and acquisition are omitted and, if the satellite auto-locating unit is omitted, also the corresponding step of acquisition is omitted. If both memory and satellite auto-locating unit are omitted, also the corresponding processing step is omitted.

As said before, the compass according to the invention presents all advantages required and during the experimental tests its performances were better than those of other known compasses, even using it under very adverse environmental conditions. The tests carried out gave the following results.

Accuracy of measurement: ±6" of arc,

Resolution: ±1",

Working temperature range: ±50° C.,

Working angular range: ±75°,

Linearity: 0.3%,

Passband: 1 Hz,

Measurement integration time: 2 seconds,

Maximum bearable acceleration: 3 g,

Adsorption: 120 mA at 12 V (DC),

Sensor weight: about 0.7 kg.

The compass thus obtained had the following features: great lightness, compactness, accuracy and inexpensiveness.

In another embodiment according to the present invention, not shown, the compass can also comprise two or more sensors.

Without leaving the scope of the invention, a person skilled in the art can carry out on the electronic analogical compass according to the invention all modifications and improvements suggested by the experience and by the natural evolution of technics.

What is claimed is:

1. Electronic compass comprising:

electronic control means;

at least a saturable core sensor having a core made of an aluminum ring supporting a coil of amorphous ferromagnetic material, the core being surrounded by an exciting electric winding;

the core sensor comprising;

a first gap, provided between the exciting electric winding and a first couple of windings filled by first rigid means; wherein said first couple of windings surrounding and being supported by said first rigid means, have reciprocally orthogonal turns;

a second gap, provided between said first couple of windings and a second couple of windings filled by second rigid means; wherein said second couple of windings surrounding and being supported by said second rigid means, have reciprocally orthogonal turns.

2. Electronic compass according to claim 1, wherein said filling means are made of a low thermal expansion coefficient material, preferably epoxy fiberglass reinforced plastic.

3. Electronic compass according to claim 2, wherein there are provided two sensors.

4. Electronic compass according to claim 1, wherein said electronic control means comprise means for determining the real course angle of the vehicle, thus counterbalancing the errors produced by magnetic deviation.

5. Electronic compass according to claim 4, wherein said electronic control means provide means configured to display the data detected by the compass.

6. Electronic compass according to claim 5, wherein said electronic control means comprise at least an analogical/digital converter and a logical unit.

7. Electronic compass according to claim 6, wherein said electronic control means also comprise a memory communicating with the logical unit and a satellite auto-locating unit and in that the logical unit acquires further data from said memory and from said satellite auto-locating unit.

8. Electronic compass according to claim 7, wherein the logical unit is adapted for carrying out at least the following steps:

a) acquire the signals emitted by the aforesaid at least a sensor, b) settle a course angle and c) acquire again the signals emitted by said at least a sensor, repeating the aforesaid cycle.

9. Electronic compass according to claim 6, wherein, by determining the course angle, the logical unit is adapted for carrying out at least the further following steps:

a) address the memory through said course angle and acquire from the memory the correction parameters stored in the memory cell addressed through said course angle;

b) obtain the real course angle;

c) acquire again the signals emitted by said at least a sensor, repeating the aforesaid cycle.

10. Electronic compass according to claim 1, wherein through each winding of the second couple of windings a signal having proportional amplitude and opposite direction in relation to the signal emitted by the corresponding winding of the first couple of windings runs.

11. Electronic compass according to claim 1, wherein through said winding a pulse current periodically saturating the core with a frequency of 9.6 kHz, a duration of 5 microseconds and an intensity of 100 A/m runs.

12. Electronic compass according to claim 1, wherein the core sensor is connected to a vehicle by suspension means comprising a couple of suspension oscillating axes placed on overlapping planes to form a composite pendulum having two different oscillating frequencies.

13. Compass according to claim 12, wherein the axes of the core sensor are turned 45° in relation to said suspension oscillating axes.

14. Electronic compass according to claim 12, wherein the suspension means are configured to counterbalance inclination angles till ±75°.

15. Electronic compass according to claim 12, wherein said suspension means comprise the couple of suspension axes made of a non-magnetic material, four ball bearings made of a non-magnetic alloy, a central supporting element of the axes and two supporting elements made of non-magnetic material sustaining said ball bearings.

16. Electronic compass according to claim 15, wherein the suspension axes are made of a copper-tin alloy and the ball bearings are made of a copper-beryllium alloy.

* * * * *